(12) United States Patent
Hiblot et al.

(10) Patent No.: US 12,154,830 B2
(45) Date of Patent: Nov. 26, 2024

(54) METHOD OF PRODUCING A GATE CUT IN A SEMICONDUCTOR COMPONENT

(71) Applicant: IMEC vzw, Leuven (BE)

(72) Inventors: Gaspard Hiblot, Leuven (BE); Anshul Gupta, Leuven (BE); Geert Van Der Plas, Leuven (BE)

(73) Assignee: IMEC vzw, Leuven (BE)

( * ) Notice: Subject to any disclaimer, the term of this patent is extended or adjusted under 35 U.S.C. 154(b) by 501 days.

(21) Appl. No.: 17/580,020

(22) Filed: Jan. 20, 2022

(65) Prior Publication Data

US 2022/0238388 A1    Jul. 28, 2022

(30) Foreign Application Priority Data

Jan. 22, 2021   (EP) ..................................... 21153044

(51) Int. Cl.
*H01L 21/8234*    (2006.01)
*H01L 27/088*     (2006.01)

(52) U.S. Cl.
CPC ................ *H01L 21/823475* (2013.01); *H01L 21/823437* (2013.01); *H01L 27/0886* (2013.01)

(58) Field of Classification Search
CPC ..... H01L 21/823475; H01L 21/823437; H01L 27/0886; H01L 21/743; H01L 21/76897;
(Continued)

(56) References Cited

U.S. PATENT DOCUMENTS 9,805,983 B1    10/2017   Cheng et al.
11,450,751 B2 *  9/2022   Su ........................ H01L 23/481
(Continued)

FOREIGN PATENT DOCUMENTS

EP    3035369 A1    6/2016
EP    3324436 A1    5/2018

OTHER PUBLICATIONS

Extended European Search Report dated Jul. 5, 2021 in European Application No. 21153044.9, 8 pages.

*Primary Examiner* — Allison Bernstein
(74) *Attorney, Agent, or Firm* — Knobbe, Martens, Olson & Bear, LLP

(57) ABSTRACT

A method of producing a gate cut in a semiconductor component is provided. In one aspect, an array of nano-sized semiconductor fins is processed on a semiconductor substrate. Rails may be buried in the substrate and in a layer of dielectric material that isolates neighboring fins from each other. The rails may extend in the direction of the fins and each rail may be situated between two adjacent fins. The rails may be buried power rails for enabling the formation of a power delivery network at the back of an integrated circuit chip. At the front side of the substrate, one or more gate structures are produced. The gate structures extend transversally, or perpendicularly, with respect to the fins and the rails. A gate cut is produced by forming an opening from the back side of the substrate, and removing a portion of the gate structure at the bottom of the opening, thereby creating a gate cut that is aligned to the sidewalls of the rail. In another aspect, a semiconductor component, such as an integrated circuit, includes a gate cut that is aligned to the sidewalls of a buried contact rail.

10 Claims, 14 Drawing Sheets

(58) Field of Classification Search
CPC ........... H01L 21/76898; H01L 23/5286; H01L 23/535; H01L 21/823431
See application file for complete search history.

(56) References Cited

U.S. PATENT DOCUMENTS

| | | |
|---|---|---|
| 2018/0069000 A1 | 3/2018 | Bergendahl et al. |
| 2020/0006155 A1 | 1/2020 | Chiang et al. |
| 2020/0105603 A1 | 4/2020 | Chang et al. |
| 2022/0359506 A1* | 11/2022 | Ng ................... H01L 29/66545 |
| 2022/0384270 A1* | 12/2022 | Tsai ................ H01L 21/823437 |

\* cited by examiner

METHOD OF PRODUCING A GATE CUT IN A SEMICONDUCTOR COMPONENT

CROSS-REFERENCE TO RELATED APPLICATIONS

This application claims foreign priority to European Patent Application No. 21153044.9, filed Jan. 22, 2021, which is incorporated by reference herein in its entirety.

BACKGROUND

Technological Field

The disclosed technology is related to semiconductor processing, in particular to finFET processing and the aspect of isolating neighboring gate electrodes on a dense array of fin structures by cutting an elongate gate structure.

Description of the Related Technology

The design rules for scaling fin-based semiconductor devices continue to evolve towards smaller dimensions. This evolution poses important challenges on the processing of these devices. One aspect that has demanded particular attention is the isolation of adjacent gate electrodes extending transversally across an array of semiconductor fins. The realization of a so-called gate cut has become more critical as the dimensions of the fins decreases. In the present patent application, a gate cut is defined as a structure placed between two collinear gate electrodes, which electrically isolates these electrodes from each other.

Many process flows for fabricating nano-sized transistors in present day semiconductor processing apply the replacement metal gate (RMG) technique, wherein a sacrificial gate provided with lateral spacers is first produced transversally on an array of parallel semiconductor fins. On silicon fins, the most commonly used material of the sacrificial gate, also called "dummy gate," is polycrystalline silicon. This can be followed by dopant implantation steps and possibly by the formation of epitaxial layers on the fin portions on either side of the dummy gate, for defining and shaping source and drain regions, and by the deposition of a dielectric layer (referred to as interlayer dielectric or ILD), to form ILD regions adjacent the spacers. The actual gate can be formed by first removing the dummy gate, and depositing in its place a gate dielectric and a stack of metal layers across one or more fins.

The gate cut may be formed before or after the replacement metal gate process. The latter option involves literally cutting a previously formed gate electrode. This approach allows to obtain a more dense arrangement of transistors on a given surface, but it also involves a number of technical difficulties. Cutting the gate, either before or post-RMG, requires lithography and etching in a small area between two adjacent fins. Due to the height of the gate and its non-planar base (wrapping around fins), it is difficult to obtain the gate cut between two fins, especially in the most advanced nodes using multiple patterning techniques for fabricating the fins. In addition, in most advanced production nodes, the MOA contacts to source and drain areas on the fins are self-aligned to the gates, which requires that the gate cuts need to be covered with a hardmask when fabricating the MOA contacts. The creation of this hardmask makes the process very complex.

In the particular context of the layout of standard logic cells on an integrated circuit chip, the above-described problem is especially acute for producing gate cuts between adjacent cells. This may be solved by increasing the spacing between fins in the area between cells, but such an approach represents a significant area consumption on the chip, reducing the number of transistors that can be integrated per unit area.

SUMMARY OF CERTAIN INVENTIVE ASPECTS

The disclosed technology aims to provide a solution to the above-described problems, as well as others. This aim can be achieved by methods and components according to the disclosed technology. According to the disclosed technology, an array of nano-sized semiconductor fins is processed on a semiconductor substrate, wherein rails are buried in the substrate and in a layer of dielectric that isolates neighboring fins from each other. The rails extend in the direction of the fins and each rail is situated between two adjacent fins. The rails may be buried power rails for enabling the formation of a power delivery network at the back of an integrated circuit chip. At the front side of the substrate, one or more gate structures are produced by any suitable method, such as the replacement gate technique. The gate structures extend transversally, and can extend perpendicularly, with respect to the fins and the rails. According to the disclosed technology, a gate cut is produced by forming an opening from the back side of the substrate, the opening overlapping a gate structure, and removing a portion of the gate structure at the bottom of the opening, thereby creating a gate cut that is aligned to the sidewalls of the rail. An advantage is that the gate cut is self-aligned to an area situated between two fins, hence there are no problems with positioning the gate cut in a limited area. Also, the gate cut formation cannot interfere with the MOA contact formation in the case of fully self-aligned MOA contacts to source/drain areas, given that the gate cut is produced from the back side of the substrate. The disclosed technology may be equally related to a semiconductor component, such as an integrated circuit, wherein it includes a gate cut that is aligned to the sidewalls of a buried contact rail.

The disclosed technology may be in particular related to a method for producing a gate cut in a gate structure extending transversally with respect to an array of nano-sized semiconductor fins, the method including the steps of:
producing the array of semiconductor fins on the front side of a semiconductor substrate, wherein the fins are embedded in a dielectric material, and wherein a plurality of rails extending parallel to the fins are buried in the substrate and in the dielectric material, each rail being present between two adjacent fins,
planarizing the front surface of the dielectric material, followed by recessing the planarized surface of the dielectric material so that top portions of the fins are exposed, the top portions extending outward from the recessed surface, while a portion of the dielectric material remains on top of the rails,
producing on the recessed planarized surface at least one gate structure extending transversally with respect to the fins, and enveloping the top portions of the fins, the gate structure including an electrode, a dielectric layer separating the electrode from the top portions of the fins and from the planarized surface, and a gate plug,
from the back side of the substrate, etching at least one trench parallel to and fully overlapping a buried rail, exposing the bottom surface of the rail at the bottom of the trench, from the back side of the substrate, producing an opening wherein the width of the opening is aligned to the width of the exposed rail, the length of the opening is fully overlapping the width of the gate structure, and wherein a portion of the gate dielectric is exposed at the bottom of the opening, removing the exposed portion of the gate dielectric at the bottom of the opening, thereby exposing a portion of the gate electrode at the bottom of the opening, followed by:

removing the exposed portion of the gate electrode at the bottom of the opening, to thereby create a gap in the gate electrode, so that the gate electrode is split into a first and second gate electrode portion, and wherein the width of the gap is aligned to the width of the opening, and producing a dielectric layer at least on the complete inner surface of the gap, thereby forming a gate cut between the first and second portions of the gate electrode, so that the gate cut is self-aligned to the width of the rail.

According to an embodiment, the rails are formed of an electrically conductive material, and:

the opening is formed through the complete thickness of the rail exposed at the bottom of the trench, and through the remaining portion of dielectric material, so that the opening divides the rail into two separate portions, one on either side of the opening, and after formation of the gate cut, and if necessary after removal of any dielectric material from the bottom surface of the separated rail portions, an electrically conductive material is deposited in the trench, to thereby electrically connect the separate rail portions.

According to another embodiment, the rails are formed of a sacrificial material, and:

after formation of the trench, the sacrificial rail exposed at the bottom of the trench is removed relative to all its surrounding materials, thereby enlarging the trench and exposing the remaining portion of dielectric material at the bottom of the enlarged trench, the opening is formed through the remaining portion of dielectric material exposed at the bottom of the enlarged trench, and after formation of the gate cut, and if necessary after removal of any dielectric material from the bottom of the trench, an electrically conductive material is deposited in the opening and in the trench, to thereby form a conductive buried rail.

According to a further embodiment, the rails are formed of a sacrificial material, and:

after formation of the trench, the opening is formed through the complete thickness of the sacrificial rail and through the remaining portion of dielectric material, so that the opening divides the rail into two separate portions, one on either side of the opening, after formation of the gate cut, the portions of the sacrificial rail are removed relative to all their surrounding materials, and an electrically conductive material is deposited in the opening and in the trench, to thereby form a conductive buried rail.

According to an embodiment, prior to the step of recessing the planarized surface of the dielectric material:

an opening is etched through the rail from the front side of the substrate, the opening is completely filled with a temporary material, forming a plug of the temporary material, the rail is thinned from the front side, relative to the plug, dielectric material is deposited on top of the thinned rail on either side of the plug, and, after the formation of the trench from the backside of the substrate, the opening is formed by removing the plug of temporary material.

According to an embodiment, the layer of dielectric material that forms the gate cut is a conformal layer. Alternatively, the layer of dielectric material that forms the gate cut may be a non-conformal layer.

According to an embodiment, the gate structure is one of an array of regularly spaced gate structures separated by dielectric portions, with spacers between the gate structures and the dielectric portions, and wherein process steps for forming source or drain contacts to the fin portions and gate contacts to the gate electrodes are performed prior to the formation of multiple gate cuts produced simultaneously from the back of the substrate. The array of gate structures may be produced by the replacement gate technique.

The disclosed technology may be equally related to a semiconductor component including:

a semiconductor substrate including at the front of the substrate an array of semiconductor fins embedded in a dielectric material, wherein a plurality of contact rails extending parallel to the fins are buried in the substrate and in the dielectric material, each rail being present between two adjacent fins, the contact rails being formed of an electrically conductive material, a first and second collinear gate structure extending transversally with respect to the fins, the gate structures each including an electrode, a dielectric layer separating the electrode from the top portions of the fins and a gate plug, and a gate cut electrically isolating the electrodes of the first and second gate structures from each other, wherein the length of the gate cut is aligned to the width of one of the contact rails.

DETAILED DESCRIPTION OF CERTAIN ILLUSTRATIVE EMBODIMENTS

Figure 1:
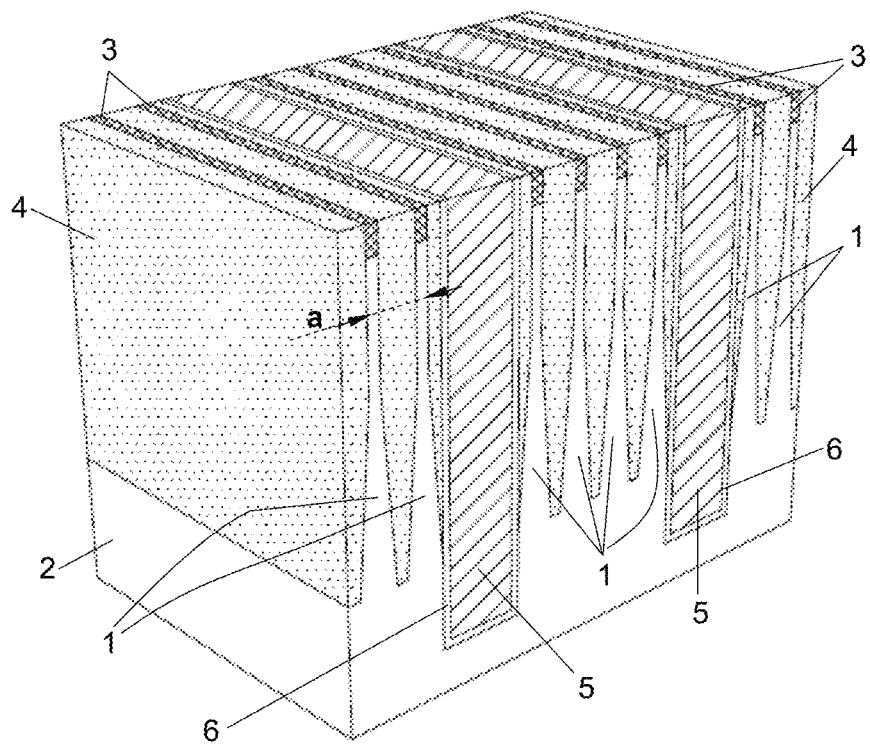
FIGS. 1 to 17 illustrate process steps applicable when executing a method of the disclosed technology in accordance with a certain embodiment.

A way of bringing a method of the disclosed technology into practice is illustrated in the drawings and will be described in detail hereafter. The particular processes, materials and dimensions referred to in this detailed description are cited by way of example and are not limiting the scope of the disclosed technology. The terms "horizontal" and "vertical" are used only with reference to the orientation of the structures shown in the drawings, and are not be understood as absolute designations of orientation.

FIG. 1 is a 3D view of a small section of a semiconductor substrate obtainable after a number of standard process steps and therefore not described here in detail. Parallel nano-sized fins 1 have been processed on a semiconductor wafer 2, most commonly this is a Si wafer. The fins 1 are obtainable by lithography and etching, applying hardmask portions 3 followed by etching the semiconductor material of the wafer 2. The dimensions of the fins 1 may be in accordance with the most advanced technology nodes in terms of the size and density of nano-sized fin-shaped features. This means that the distance a between two fins may be between 20 and 50 nm, the width of the fins being in the order of 2 to 10 nm. The fins are embedded in a dielectric material 4, for example silicon oxide, sometimes referred to as the STI dielectric (shallow trench isolation). The image shows a central group of 4 fins placed at the mutual distance a, with a somewhat larger distance between the central group and the groups placed on either side thereof. In this larger space, buried contact rails 5 are situated. These are elongate electrically conductive structures, for example formed of tungsten, ruthenium or amorphous silicon, extending parallel to the fins 1, and buried partly in the semiconductor wafer 2 and partly in the dielectric material 4. A dielectric liner 6 electrically isolates the rails 5 from the semiconductor wafer 2 and separates the rails 5 from the dielectric material 4. The upper surface of the substrate is planarized by a suitable technique, such as grinding and/or chemical mechanical polishing (CMP). Only a thin upper portion of the wafer 2 is shown. The thickness of this wafer 2 is much higher than the fin height.

Buried contact rails are described, for example, in European Patent App. Publication EP3324436A1. The function of the rails is to enable the formation of connections from active devices which are to be processed (see below) at the front of the wafer 2, towards the back of the wafer. These connections may be formed by producing "through semiconductor vias" (TSVs) through the wafer 2, between the buried rails 5 and a redistribution layer and contact terminals which are to be produced at the back of the wafer. As described in European Patent App. Publication EP3324436A1, it is advantageous to produce a power delivery network on the wafer's backside for supplying power towards active devices at the front of the wafer. This is why the buried contact rails are often generally referred to as buried power rails. The exact function of the rails 5 is, however, not determined within the context of the disclosed technology. Methods for producing the rails described in European Patent App. Publication EP3324436A1 are applicable for forming the buried rails 5 in methods of the disclosed technology.

A number of process steps according to a certain embodiment of the disclosed technology will now be explained with reference to FIGS. 2 to 17 which show only two pairs of fins 1 on either side of one of the buried rails 5. The same process steps may, however, be performed simultaneously on a plurality of rails 5.

Figure 2:
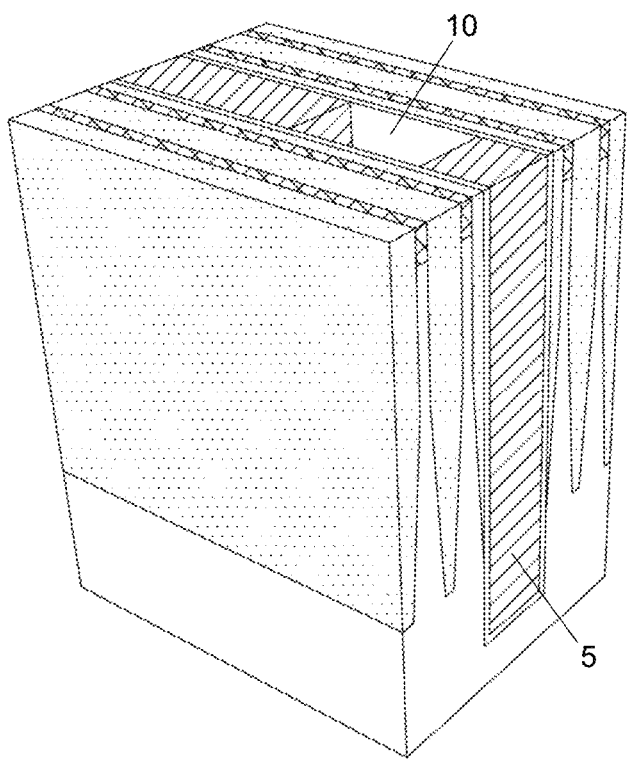

As shown in FIG. 2, an opening 10 is etched anisotropically through the contact rail 5, stopping on the dielectric liner 6. This may be done by lithography and etching, applying a hardmask on the planarized surface, and etching away the material of the rail. The etch process is selective with respect to the liner 6 and the dielectric 4, so that the opening 10 is self-aligned to the sidewalls of the rail 5. In the case of a contact rail formed of tungsten, this can be done, for example, by a plasma etch using $SF_6$ as the precursor gas.

Figure 3A:
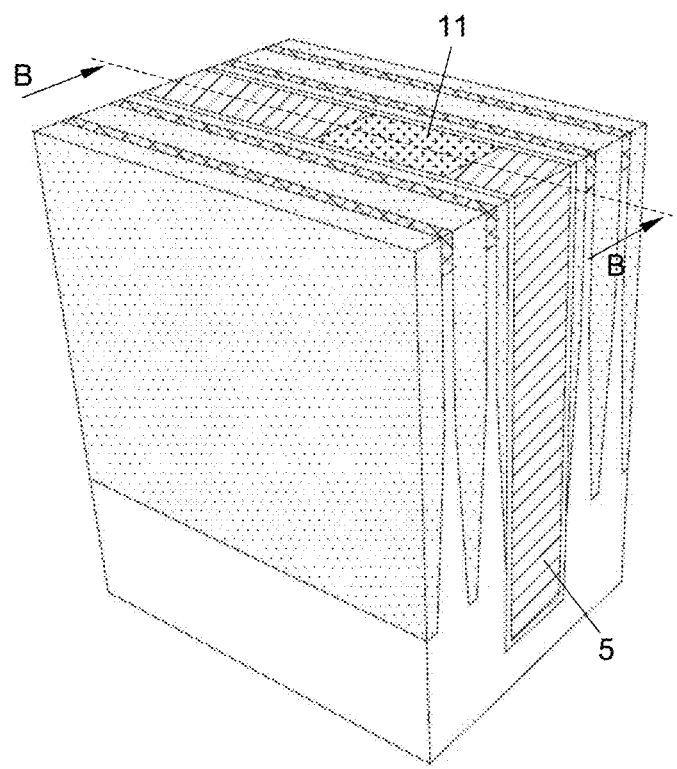
Figure 3B:
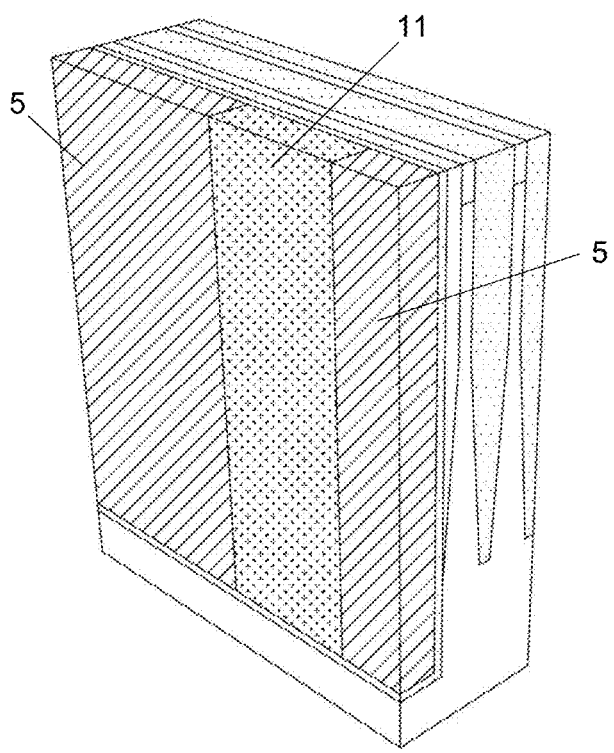

The opening 10 is then filled with a temporary material by depositing the material inside the opening and on top of the substrate, and thinning+planarizing the substrate until the hardmask portions 3 are again exposed, as illustrated in FIGS. 3A and 3B, the latter showing a section through the rail 5. The temporary material then forms a plug 11 with the dimensions of the opening 10. The temporary material may be silicon nitride for example, deposited by Plasma Enhanced Chemical Vapour Deposition (PECVD) or Plasma Enhanced Atomic Layer Deposition (PEALD) and thinned+planarized by grinding and/or CMP.

Figure 4:
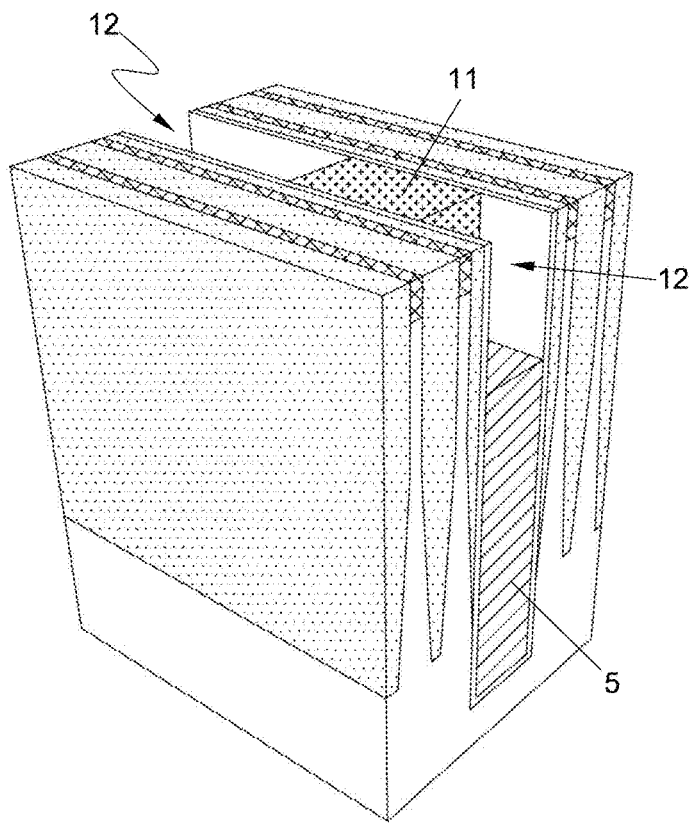
Figure 5:
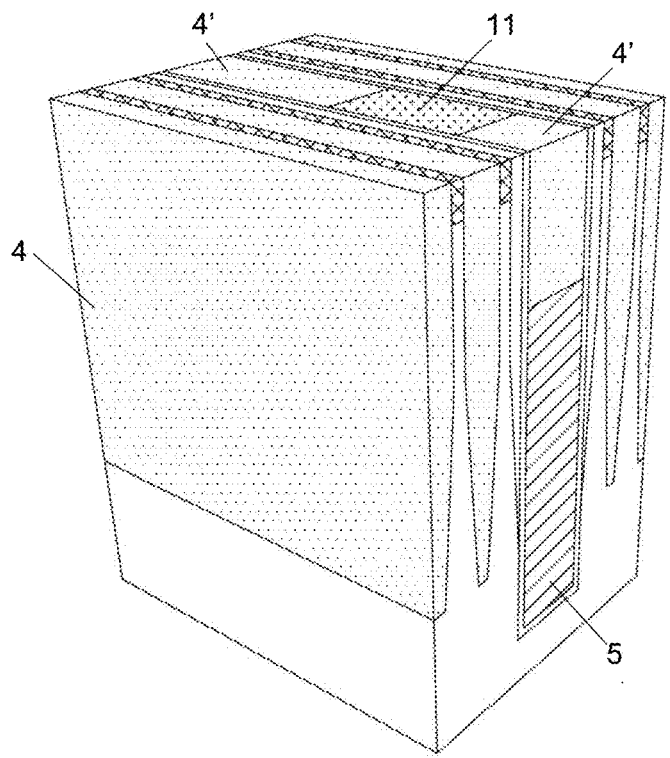
Figure 6:
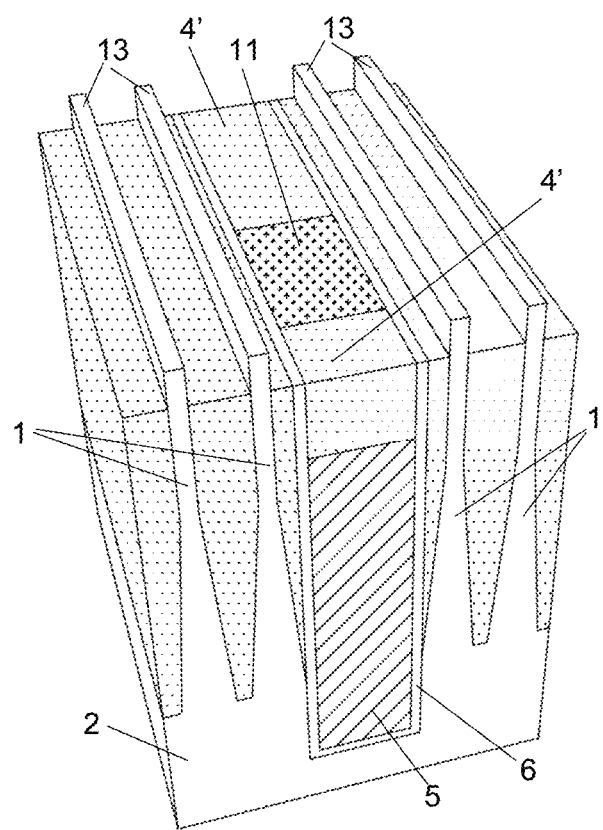

Following this, the material of the rail 5 is etched back by a selective etch process relative to the liner 6 and relative to the plug 11, as illustrated in FIG. 4, thereby thinning the rail 5 down to a lower thickness, and forming a trench 12 that is interrupted by the plug 11. As shown in FIG. 5, the trench 12 is filled with a dielectric 4', which can be the same as the dielectric 4, by depositing the dielectric in the trench 12 and on top of the substrate, after which the upper surface is again planarized. As shown in FIG. 6, by further selective etch steps, the materials of the dielectric layers 4 and 4', the liner 6 and the plug 10 are etched back relative to the fins 1, and the hardmask portions 3 are stripped, thereby revealing top portions 13 of the fins above the recessed surface. The recessed dielectric material 4' remains above the rail 5.

Figure 7A:
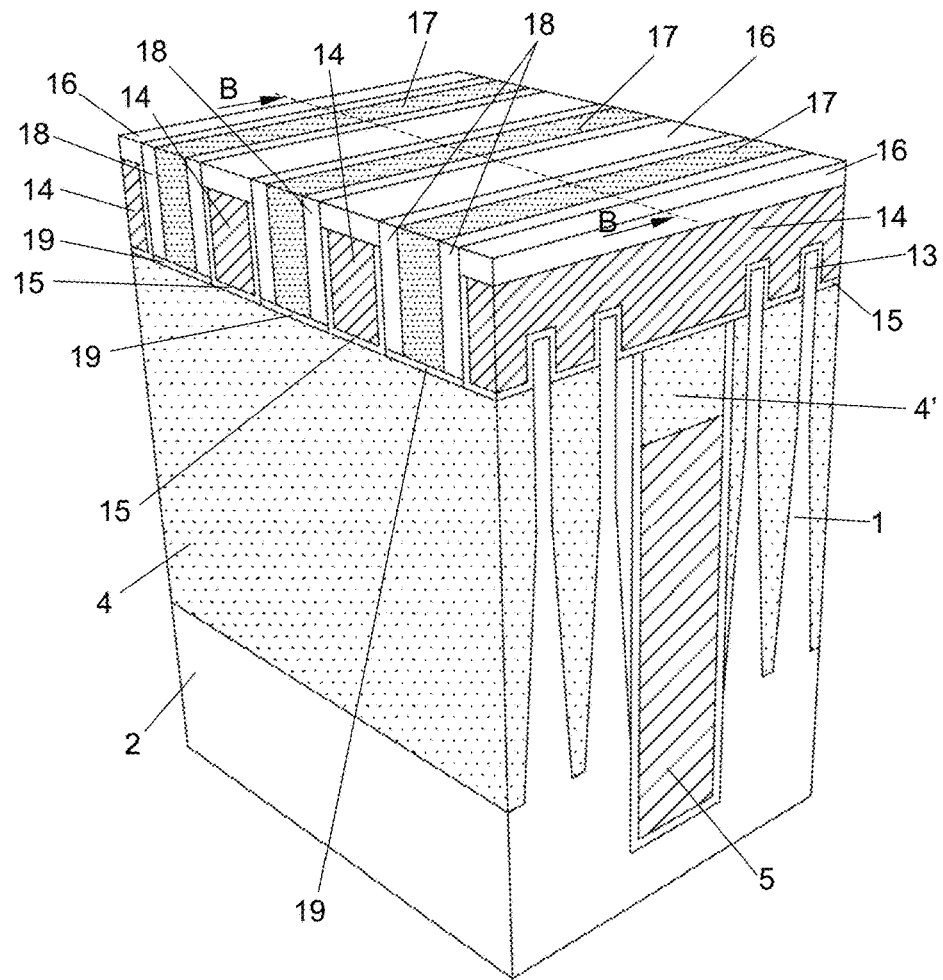

Then a series of standard process steps is executed, for producing an array of regularly spaced metal gate electrodes 14 extending perpendicularly with respect to the fins 1, and enveloping the top portions 13 of the fins. The result of these steps is shown in FIG. 7A. The gate electrodes 14 are separated from the top portions 13 of the fins by a gate dielectric layer 15, which also envelopes the gate electrodes 14 themselves along their longitudinal direction up to a given height. Above this height, gate plugs 16 are present which isolate the gate electrodes from the upper layers which are to be processed later. Each gate electrode 14 may include a metal core, for example formed of tungsten, and a conformal multilayer of various materials such as work function metals and/or other materials. This structure can be a standard structure and is not represented in detail in the drawings. The gate dielectric 15 can be a high K dielectric, for example $Hf_2O$. The gate plugs 16 may be formed of silicon nitride or silicon oxide for example. The assembly of the gate electrode 14, gate dielectric layer 15 and gate plug 16 is referred to as a "gate structure" in the present context.

In between the gate structures, elongate portions 17 of dielectric material are present, which are separated from the gate structures by spacers 18. The elongate dielectric portions 17 are formed of material generally known as "interlayer dielectric" (ILD), that is, dielectric material suitable for isolating electrical conductors of an interconnect structure also known as the back end of line structure of an integrated circuit chip. The ILD material may be, for example, silicon oxide. Underneath the ILD material 17 and enveloping the top portions 13 of the fins may be epitaxially grown source or drain contact areas.

A dielectric layer 19, for example silicon nitride, can separate the ILD portions 17 and spacers 18 from the STI material 4 into which the fins 1 are embedded. The spacers 18 may be formed of silicon oxycarbide (SiCO). The structure shown in FIG. 7A is standard and may be produced by the replacement gate technique, wherein for example polysilicon dummy gate structures are first formed together with the spacers 18 and dielectric portions 17, after which the dummy gates are replaced by the gate electrodes.

Figure 7B:
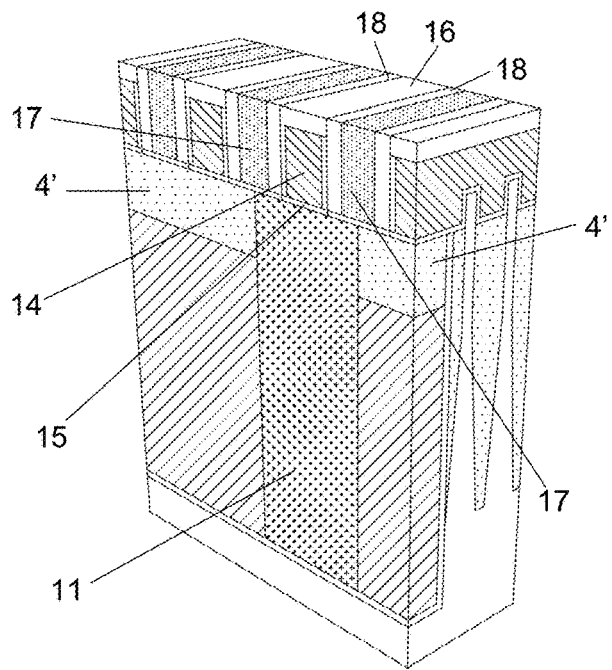

As seen in the section view in FIG. 7B, the width of one of the gate structures 14/15/16 lies fully within the length of the plug 11 in the direction of the buried rail 5.

Figure 8:
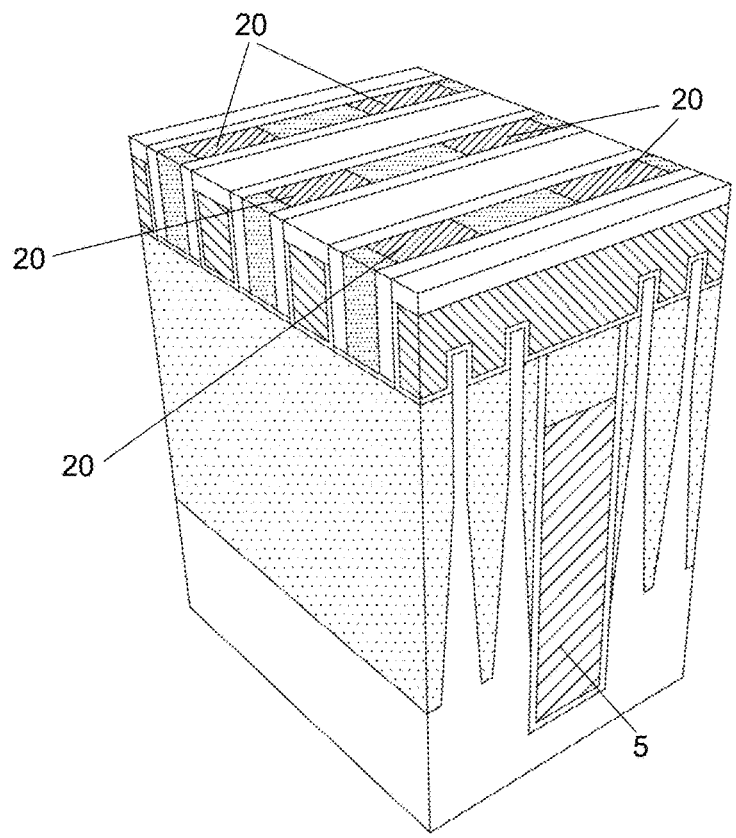

As shown in FIG. 8, local interconnects 20 are formed for contacting the source or drain areas of the fin portions 13. The local interconnects 20 are self-aligned to the dielectric portions 17 between two adjacent spacers 18 and are formed of an electrically conductive material. Other local interconnects (not shown) are formed for contacting the gate electrodes 14. The local interconnects are also referred to as the MOA level of an integrated circuit processed on the wafer 2, and will be connected to the first level of the BEOL structure that is to be processed later on top of the MOA level. Some of the local interconnects (not the ones shown in FIG. 8) are connected to the underlying rails 5, for example for supplying power to the transistors processed at the front of the substrate. The processes for producing these local interconnects 20 are also standard and not described here. The electrical connection between some of the local interconnects 20 and the buried rails 5 may be realized by via connections, using standard techniques. However, according to a specific embodiment of the disclosed technology, local interconnects 20 required to contact the buried rails are contacting the buried rails 5 directly. The latter option may be particularly advantageous when a gate cut according to the disclosed technology is produced between two logic cells.

This is followed by the formation of the BEOL stack, not shown in the drawings, after which the substrate is flipped and a number of back-side processing steps are to be executed in accordance with the disclosed technology as described hereafter.

Figure 9:
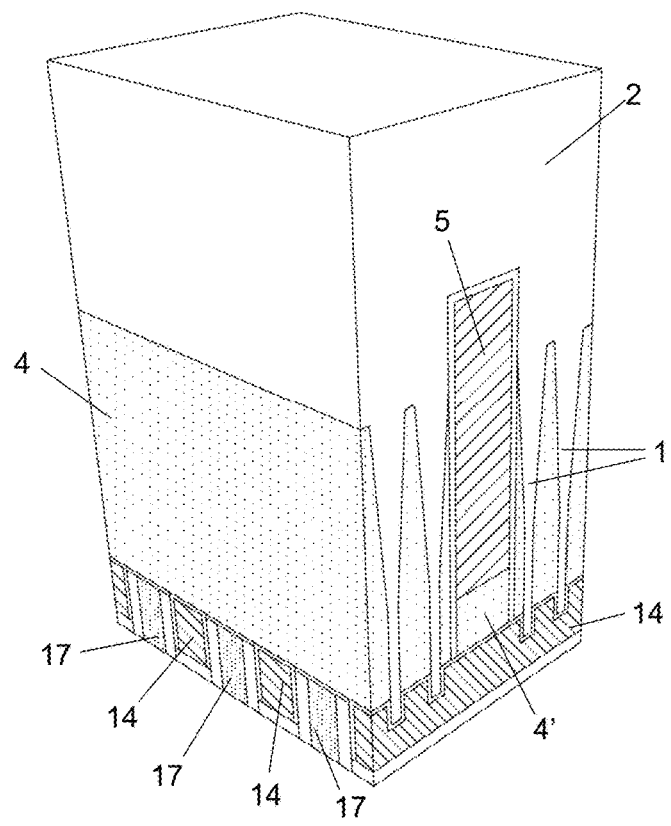

The wafer 2 is t bonded to a carrier (not shown) and thinned from the back side before performing the next steps. This thinning is done by grinding and/or CMP according to recipes applied to the back side of the wafer, such as described for example in European Patent App. Publication EP3324436A1. FIG. 9 shows the substrate with the backside facing upwards. At this point, the gate structures 14/15/16 are still continuous, that is, no gate cuts have been produced. A thicker portion of the (thinned) semiconductor wafer 2 is shown in order to better visualize the various steps.

Figure 10:
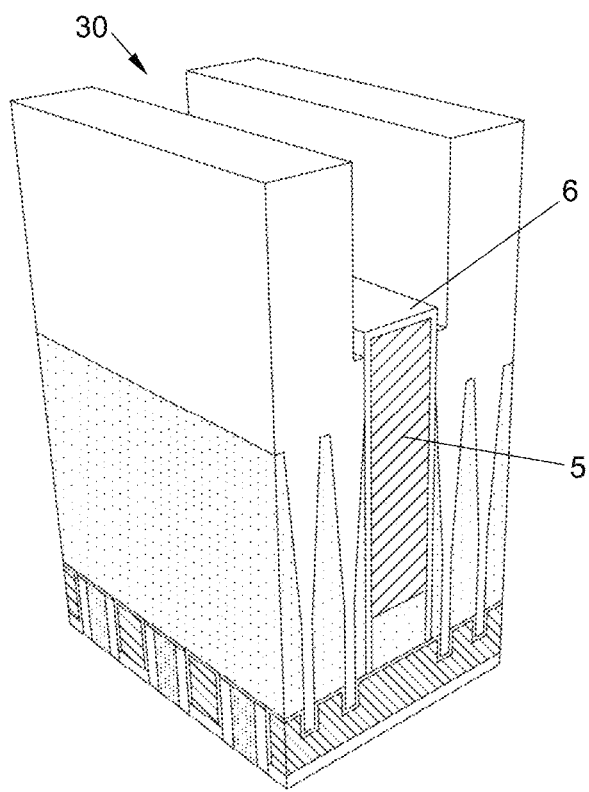
Figure 11:
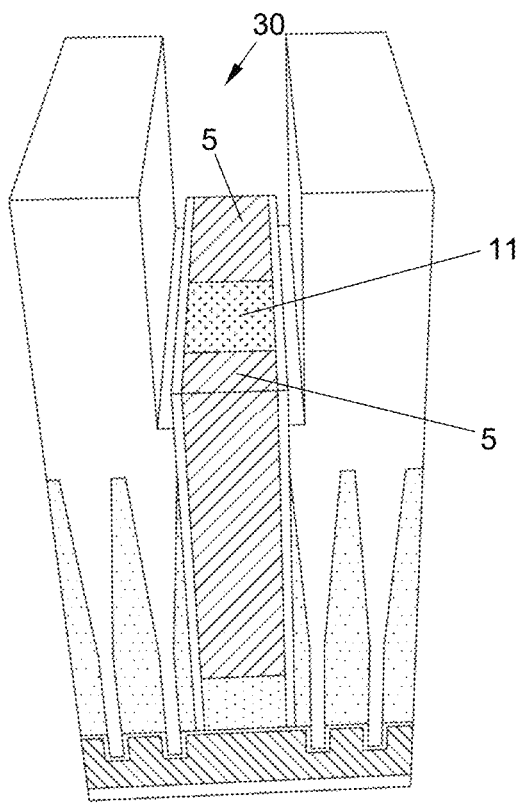

Referring to FIG. 10, a trench 30 is etched from the (thinned) backside, parallel to the buried rail 5 and stopping on the liner 6. The width of the trench 30 is a little oversized with respect to the width of the rail 5 and the liner 6, so that the bottom surface of the liner 6 and part of the lateral liner portions around the rail 5 are exposed at the bottom of the trench 30. The trench 30 may be formed by standard lithography and etch techniques. Then the liner 6 is removed from the bottom of the rail 5 (see FIG. 11), thereby exposing the bottom surface of the rail and of the initially produced temporary plug 11. The removal of the liner 6 may be done by a plasma etch process that removes only horizontal layers while essentially preserving the materials on vertical surfaces such as on sidewalls of an opening or trench. Such processes are disclosed, for example, in European Patent App. Publication EP3035369A1.

Figure 12A:
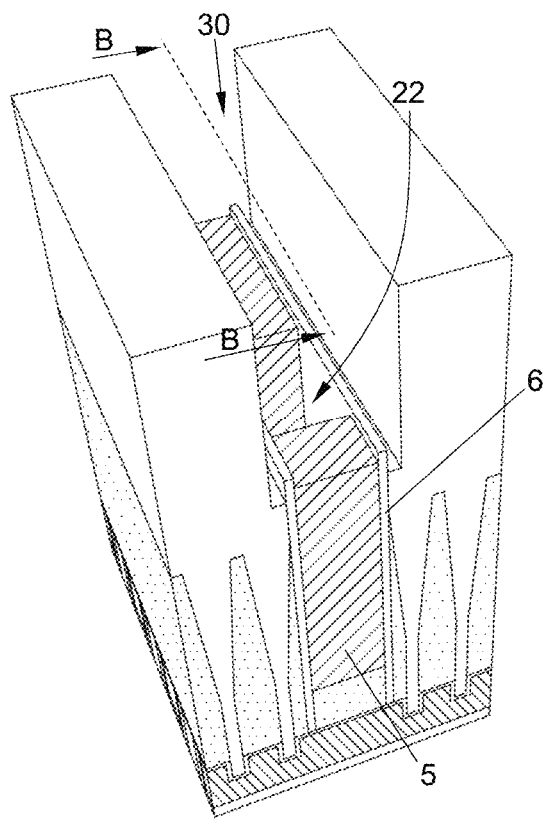
Figure 12B:
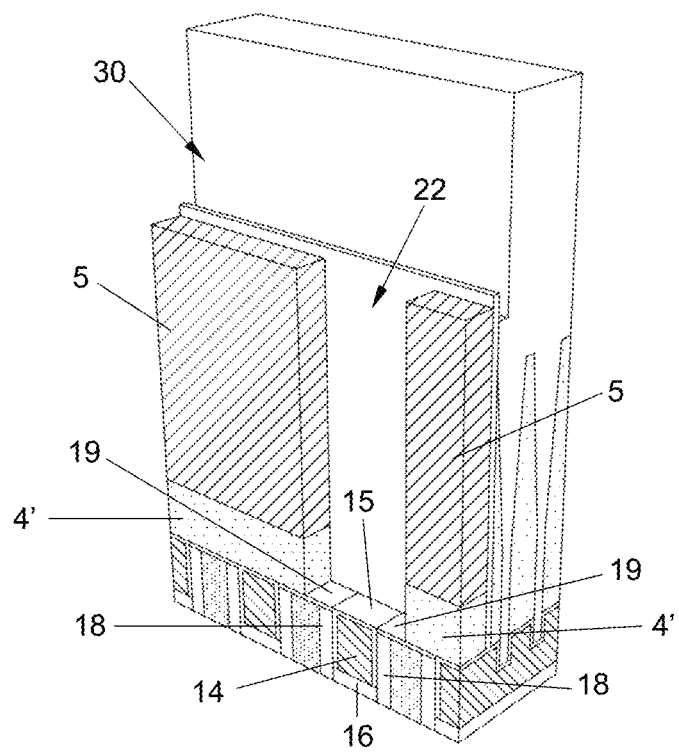

The plug 11 is then removed selectively with respect to the rail 5 and the liner 6 (see FIG. 12A). Selectivity may be less than absolute, in which case the rail 5 and the liner 6 are also thinned to a certain degree, as illustrated in FIG. 12A. The removal of the plug 11 creates an opening 22 in the rail 5, that is self-aligned to the side walls of the rail 5, that is, the width of the opening 22 is aligned to the width of the rail 5. As seen in the section view in FIG. 12B, at the bottom of the opening 22 a portion of the gate dielectric layer 15 as well as portions of the dielectric layer 19 on either side of the gate structure 14/15/16 are exposed.

Figure 13:
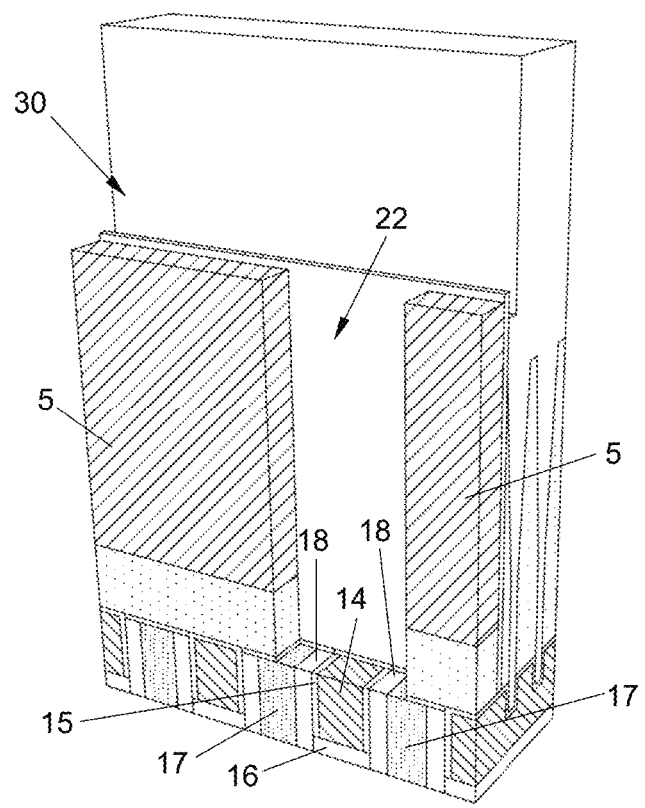

The gate dielectric 15 and the dielectric layer 19 are then etched back until the gate electrode 14 is exposed at the bottom of the opening 22 (see FIG. 13). This may again be done by the above-referenced plasma etch process.

Figure 14:
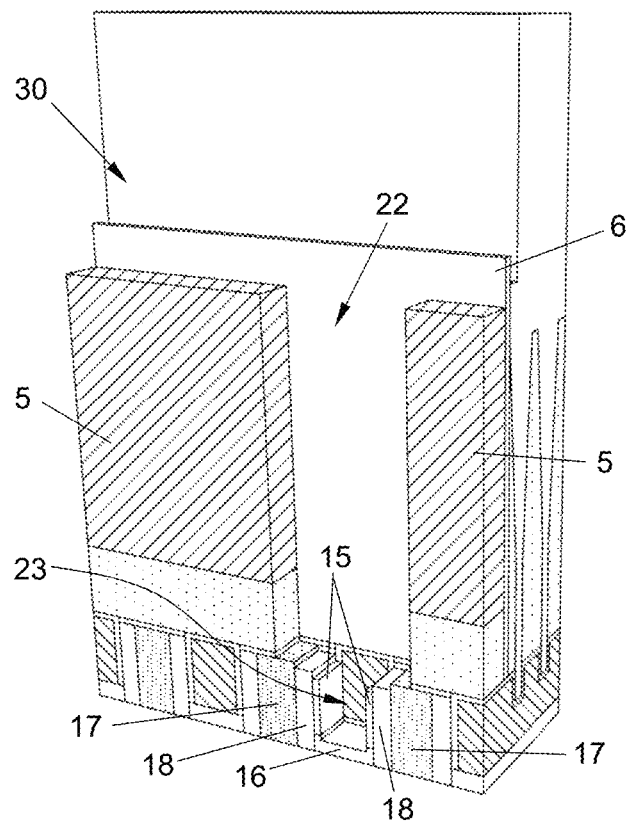

As illustrated in FIG. 14, this is followed by removing the material of the gate electrode 14 selectively with respect to the surrounding material, until reaching the gate plug 16, thereby creating a gap 23. This can be done again by a plasma etch. The gap divides the gate electrode into a first and second portion of the gate electrode 14. The etch selectivity may again not be absolute, so that the ILD portions 17, the spacers 18 and the gate dielectric 15 that is present along the sidewalls of the gate electrode 14 may also be partially removed, as illustrated in the drawing. The formation of the gap 23 is self-aligned to the sidewalls of the opening 22, and hence to the side walls of the buried rail 5. The removal of the electrode material may also partially remove the gate plug 16, as illustrated in the drawing. The etching of the gate electrode 14 need not be selective to the material of the rail 5. If there is no etch selectivity, the rail 5 is thinned after the removal of the gate electrode, as illustrated in FIG. 14, which is however acceptable, provided that a sufficient rail height remains after the etch.

Figure 15A:
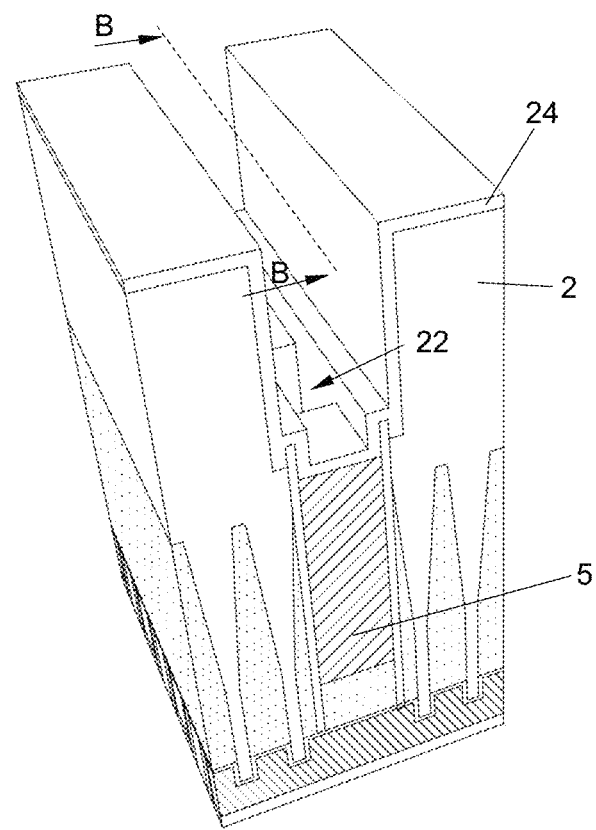
Figure 15B:
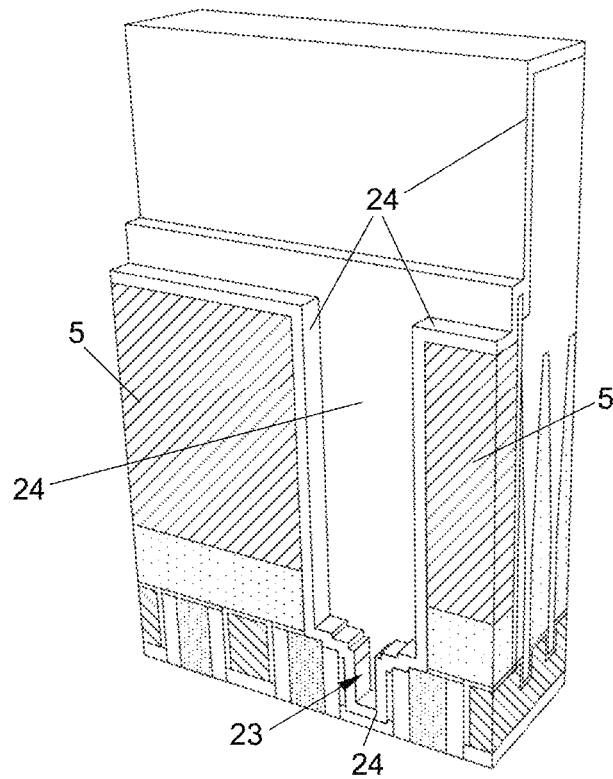
Figure 16:
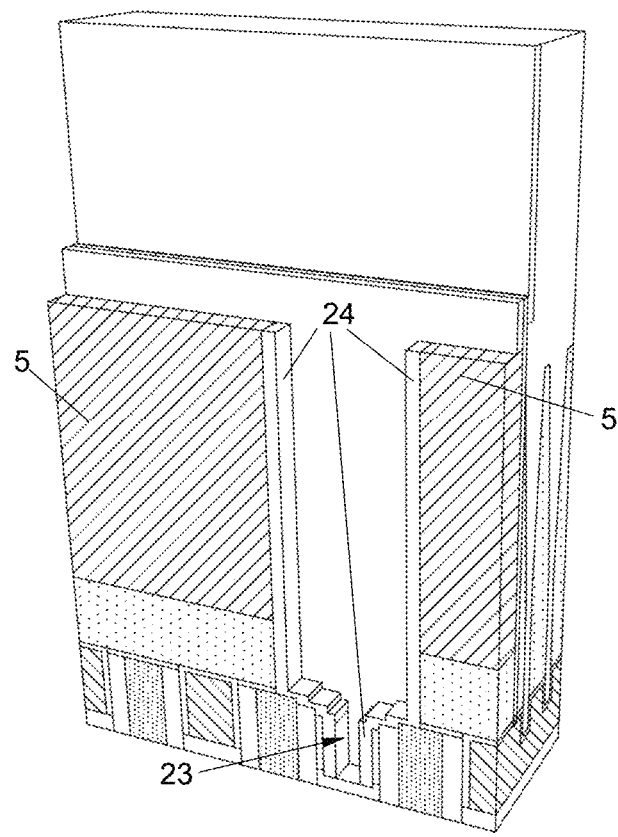

A conformal dielectric layer 24 is then deposited (see FIG. 15A and the section view in FIG. 15B). This could be silicon oxide, for example. The conformal layer 24 lines the back side surface of the substrate, the sidewalls and horizontal surfaces of the trench 30 and the opening 22 and the sidewalls and bottom of the gap 23 on all four sides. The conformal layer 24 is then removed by a plasma etch from at least the horizontal surface of the rail 5 while maintaining it on all sidewall surfaces (see FIG. 16). As seen in the drawing, the conformal layer 24 need not be removed fully from all horizontal portions within the opening 22. In accordance with the disclosed technology, the layer 24 is removed from the horizontal surface of the rail 5.

Figure 17:
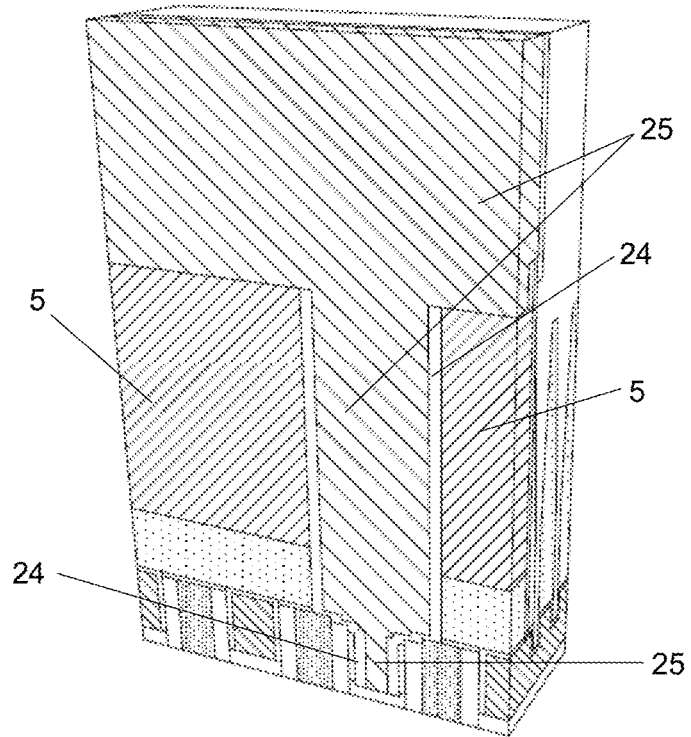

Finally, as shown in FIG. 17, an electrically conductive material 25 is deposited, filling the gap 23 and the opening 22 in the rail, as well as the trench 30, thereby forming an electrical connection between the rail portions on either side of the opening 22.

The central portion of the gap 23 is thereby filled with the conductive material 25 which is surrounded in this gap by the conformal layer 24 on all sides. Hence, this filled-up gap 23 now represents the actual gate cut, that is, a structure that electrically isolates two collinear gate electrodes from each other. It is also possible that the thickness of the conformal layer 24 is higher than represented in the drawing, to the extent that the material of the conformal layer 24 fills the gap 23 completely, that is, there is no longer a gap after the conformal layer deposition.

This process therefore completes the formation of the gate cut from the back side and self-aligned to the width of a buried contact rail 5. This has the advantage that the gate cut is self-aligned to the sidewalls of the buried rail 5 and thereby automatically fits between two adjacent fins 1. This way of producing a gate cut is therefore particularly suitable in areas where the space between fins is limited, such as in the area between adjacent standard logic cells. The formation of the gate cut cannot interfere with the fabrication of the MOA contacts, given the fact that the gate cut formation is now fully done from the back side of the wafer in accordance with the disclosed technology.

As stated above, the conductive material 25 is deposited on the backside of the wafer 2, filling the gap 23, the opening 22 and the trench 30. This is followed by planarizing the backside surface of the wafer 2 so that the material 25 is at the same level as the wafer material, as shown in FIG. 17. This may be followed (not shown) by forming a dielectric passivation layer and constructing backside contacts or a backside BEOL structure. The material 25 together with the original rail 5 therefore forms the final buried contact rail in the finished component.

In the above-described embodiment, the opening 22 in the rail 5 is produced by first producing the temporary plug 11 at the front of the wafer 2, prior to the formation of the gate structures, and removing this plug 11 from the back of the wafer after the gate structure formation. This allows to ensure that the opening 22 is correctly aligned with respect to the gate structure that needs to be cut. This way of producing the opening 22 therefore represents an advantageous embodiment of methods of the disclosed technology.

Figure 18:
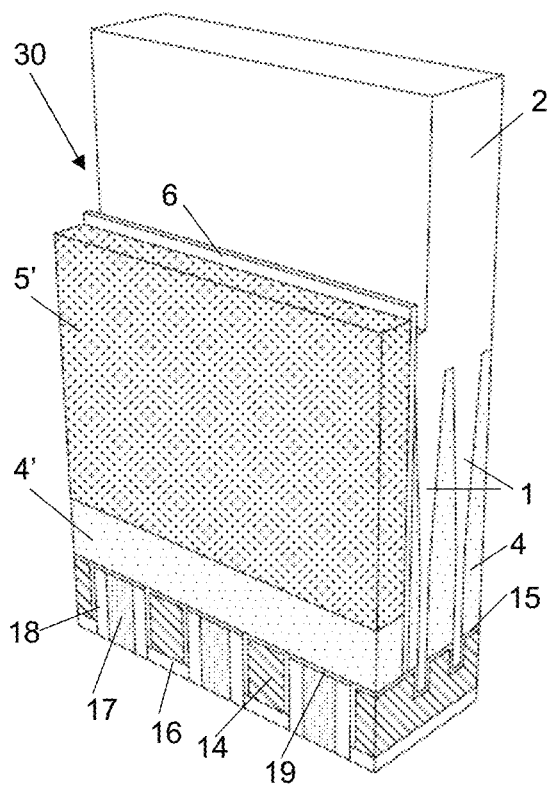
FIGS. 18 to 23 illustrate steps applicable according to an embodiment wherein a sacrificial rail is applied, that is afterwards replaced by an electrically conductive rail.

According to an alternative embodiment, the opening 22 is produced in a different way, namely by etching through the electrically conductive (for example tungsten) rail 5 from the backside of the wafer, after producing the gate structures 14/15/16, the MOA contacts and the BEOL stack at the front of the wafer. This way of processing may make it more difficult to correctly align the opening 22 to the gate structure that needs to be cut, given that the position of the gate structures may be shifted due to wafer distortion occurring as a consequence of bonding the wafer to a carrier and thinning the wafer. This approach is however possible, and may be enabled by adapting the dimensions and position of the opening 22 to compensate for the shift. Etching through the rail 5 from the back side takes place after producing the trench 30. This trench 30 may be produced in the same way as described above, with reference to FIGS. 10 and 11. The opening 22 is then produced by etching anisotropically through the rail 5 using the same or equivalent etch process applied for etching the opening 10 from the front of the rail in the first embodiment (FIG. 2), so that opening 22 is self-aligned to the sidewalls of the rail 5. In this case, the dielectric 4' is present on the full upper surface of the rail 5, and etching the opening 22 requires also anisotropic etching through this dielectric material 4', which may require an adapted etch recipe. The etching of opening 22 stops on the gate dielectric 15 and dielectric layers 19 (FIG. 12A/12B). After this, the method steps are the same as the ones described with reference to FIGS. 13 to 17. According to a further alternative, the rails 5, as produced at the start of the method of the disclosed technology, as shown in FIG. 1, are not formed of an electrically conductive material, but they are formed of a sacrificial material, for example silicon nitride, and these sacrificial rails are replaced by an electrically conductive material later in the process. One way of realising this is illustrated in FIGS. 18 to 23, which are all sections along the plane B-B used also in a number of the previous drawings. FIG. 18 illustrates the step of forming the trench 30. The steps up to this point are the same as described for the first embodiment, except that the rail 5' is now formed of a sacrificial material, for example silicon nitride. MOA contacts (not shown) have also been formed as described above. These MOA contacts may be connected to the sacrificial rails 5' through via connections, or they may be in direct physical contact with the rails 5'.

Figure 19:
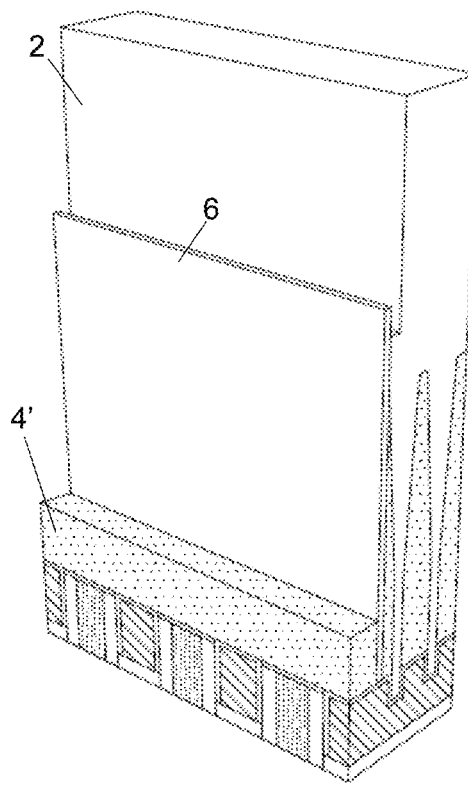
Figure 20:
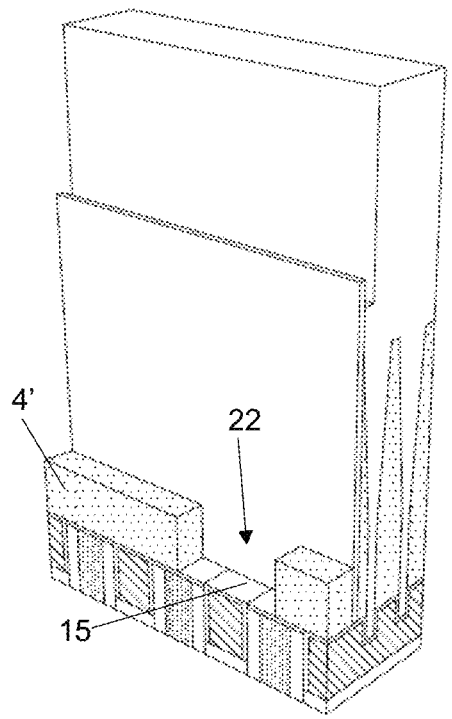
Figure 21:
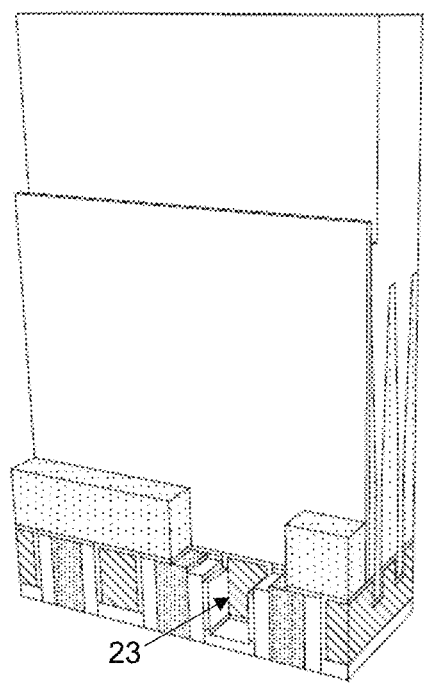
Figures 22, 23:
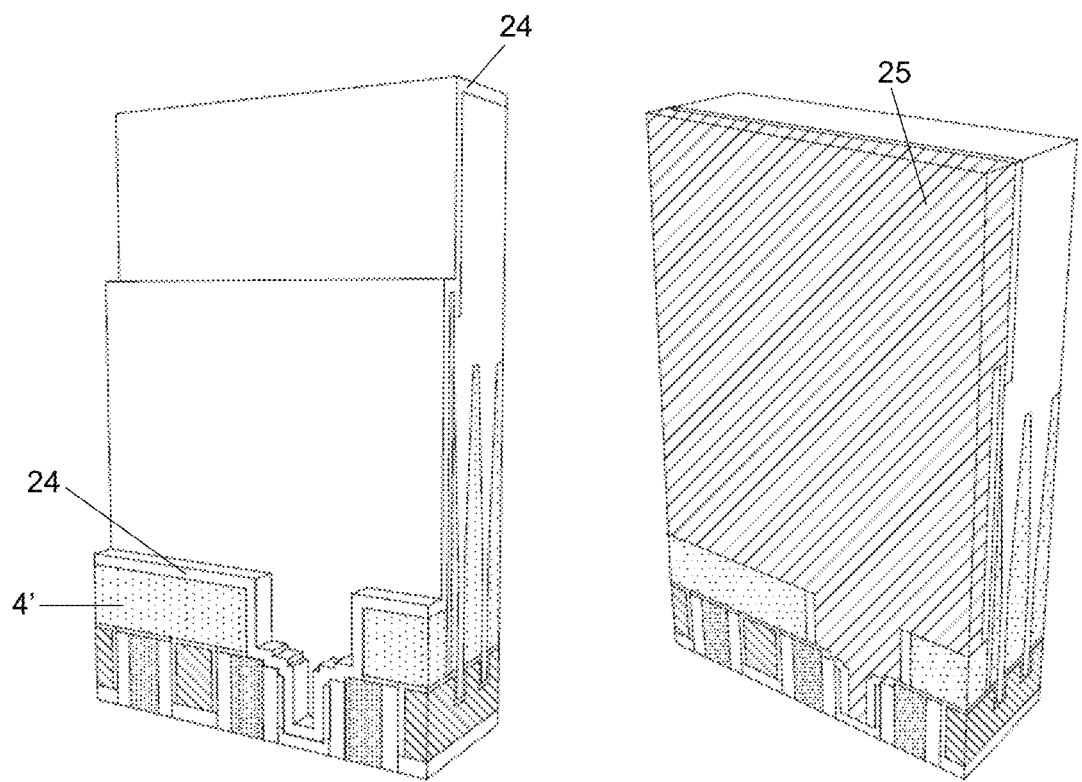

As shown in FIG. 19, the sacrificial rail 5' is then removed selectively with respect to all surrounding materials, thereby enlarging the trench 30, that is, making the trench 30 deeper and exposing the dielectric 4' at the bottom of the enlarged trench. As shown in FIG. 20, the opening 22 is etched through the exposed dielectric layer 4', the etch being self-aligned to the sidewalls of the trench 30 on either side of the bottom of the enlarged trench 30. The width of the opening 22 is therefore aligned to the width of the (now removed) rail 5'. The gate oxide 15 and gate electrode 14 are removed as shown in FIG. 21, by similar etching techniques as in the first embodiment. In this way, the gap 23 is formed, equally as in the first embodiment. Then, with reference to FIG. 22, the conformal dielectric liner 24 is deposited, again as in the first embodiment. After removing the liner 24 from the horizontal surface of the dielectric 4' and maintaining it on the sidewalls, the enlarged trench 30 is filled with an electrically conductive material 25, as shown in FIG. 23. The material 25 now fulfills the role of the buried contact rail, connecting the MOA contacts to the back of the substrate. The electrical contact between the MOA contacts and the newly formed conductive rail 25 may be established through previously formed via connections between the contacts and the sacrificial rail 5', or in case the sacrificial rail 5' was in direct contact with the MOA contacts, the conductive rail 25 is also in direct contact with the MOA contacts.

One advantage of this embodiment is that the material 25 used for the complete buried rail is applied from the back of the wafer and after performing numerous processing steps employing high thermal budgets. The latter is the reason why the buried rails are normally formed of specific materials such as tungsten or ruthenium, which however exhibit higher resistivity than more common conductive materials such as copper. In the embodiment of FIGS. 18-23, however, copper can be used as it is applied later in the process.

In an alternative to the embodiment of FIG. 18-23, the opening 22 is produced through the sacrificial rail 5', followed by depositing the dielectric liner 24, etching back the liner 24 from the horizontal surfaces, and selectively removing the sacrificial rail 5' and replacing it by the conductive material 25.

In either the embodiment of FIGS. 18-23 itself or in the above alternative, the opening 22 could be formed by the removal of a previously produced temporary plug through the dielectric 4', as in the first embodiment, instead of by etching the opening 22 from the backside of the wafer. When the sacrificial rail 5' is removed before the formation of the opening 22 (as in FIGS. 18-23), the material of the temporary plug could be the same as the material of the sacrificial rail, and removal of the plug and the rail, and thereby creation of the opening 22 could take place in one process step. When the sacrificial rail 5' is removed after the formation of the opening 22, the material of the temporary plug needs to be different from the material of the sacrificial rail, and removable selectively with respect to the sacrificial rail.

Figure 24:
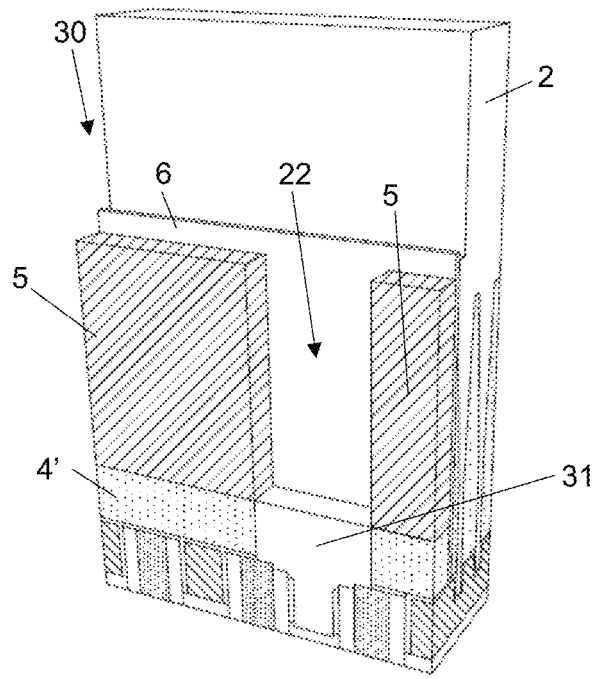
FIGS. 24 to 26 illustrate an alternative way of depositing a dielectric for realizing the gate cut in accordance with an embodiment of the disclosed technology.
Figure 25:
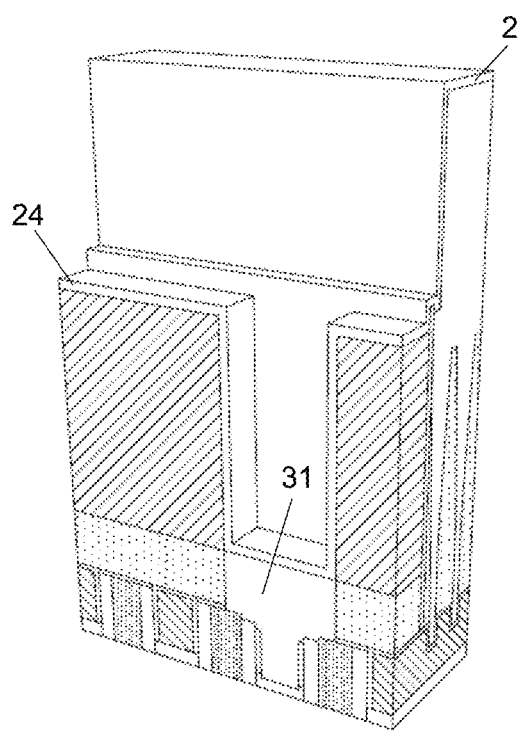
Figure 26:
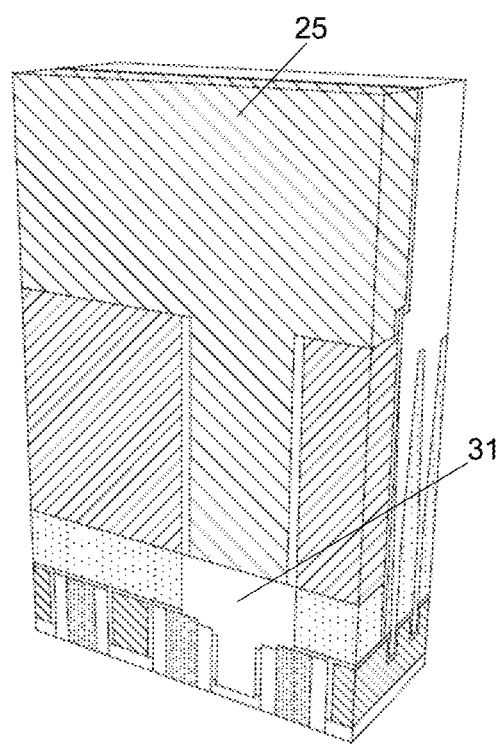

In any one of the embodiments described above, the formation of the actual gate cut, that is, the isolation between two collinear gate electrodes, occurs by the deposition of the liner 24. The use of a liner is advantageous given that the liner 24 at the same time provides an isolation between the conductive material 25 and the semiconductor material of the wafer 2. However, the disclosed technology is not limited to this way of realizing the gate cut. An alternative way is to fill the opening 22 (obtained in accordance with any one of the above-described embodiments) and the gap 23 with a non-conformal dielectric (that is, not lining the sidewalls but filling the opening 22 and the gap 23 completely). This is illustrated in FIGS. 24-26 for the case of a non-sacrificial rail 5 (for example tungsten). FIG. 24 illustrates how the opening 22, produced in accordance with the first embodiment, is filled with a non-conformal dielectric 31, for example silicon oxide, that also fills the gap 23 at the bottom of the opening. The dielectric 31 may be formed by depositing a non-conformal layer across the entire back side of the wafer 2 and etching this layer back. The dielectric 31 thereby forms the gate cut, by isolating the cut portions of the gate electrode 14 from each other. As shown in FIGS. 24 and 25, this may be followed by depositing a liner 24, etching back the liner 24 on the horizontal portions as described above, and depositing an electrically conductive material 25, connecting the rail portions on either side of the opening 22. Alternatively, if isolation between the material 25 and the wafer 2 is not required, the liner 24 may be omitted and the material 25 may be deposited directly on the dielectric 31.

The disclosed technology may be equally related to a semiconductor component such as an integrated circuit chip, obtainable by methods of the disclosed technology. The component includes transistors built at the front side of an array of nano-sized fins 1, each transistor including a source and drain area and a gate structure 14/15/16 between the source and drain, wherein the gate structures are elongate structures arranged transversally with respect to the fins. The component further includes buried rails extending in the direction of the fins, each rail being arranged in between two adjacent fins. In a component produced according to the embodiment shown in FIGS. 1-17, a buried rail in the finished component consists of the original rail 5 and the material 25 used to fill the opening 22 and the trench 30. In the embodiments involving a sacrificial rail 5', the buried rail in the final component consists only of the material 25. In a component according to an embodiment of the disclosed technology, at least two collinear gate electrodes, that is, gate electrodes which extend along the same line, are separated and isolated from each other by a gate cut that is aligned to the sidewalls of one of the buried rails. In other words, the length of the gate cut between a first and second of a pair of collinear gate electrodes is aligned to the width of the buried rail.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A method of producing a gate cut in a gate structure extending transversally with respect to an array of nano-sized semiconductor fins, the method comprising: producing the array of semiconductor fins on the front side of a semiconductor substrate, wherein the fins are embedded in a dielectric material, and wherein a plurality of rails extending parallel to the fins are buried in the substrate and in the dielectric material, each rail being present between two adjacent fins; planarizing the front surface of the dielectric material, followed by recessing the planarized surface of the dielectric material so that top portions of the fins are exposed, the top portions extending outward from the recessed surface, while a portion of the dielectric material remains on top of the rails; producing on the recessed planarized surface at least one gate structure extending transversally with respect to the fins, and enveloping the top portions of the fins, the gate structure comprising a gate electrode, a gate dielectric separating the gate electrode from the top portions of the fins and from the planarized surface, and a gate plug; from the back side of the substrate, etching at least one trench parallel to and fully overlapping a buried rail; exposing the bottom surface of the rail at the bottom of the trench, from the back side of the substrate, producing an opening, wherein the width of the opening is aligned to the width of the exposed rail, the length of the opening fully overlapping the width of the gate structure, and wherein a portion of the gate dielectric is exposed at the bottom of the opening; removing the exposed portion of the gate dielectric at the bottom of the opening, thereby exposing a portion of the gate electrode at the bottom of the opening, followed by: removing the exposed portion of the gate electrode at the bottom of the opening, to thereby create a gap in the gate electrode, so that the gate electrode is split into a first and second gate electrode portion, and wherein the width of the gap is aligned to the width of the opening, and producing a dielectric layer at least on the complete inner surface of the gap, thereby forming a gate cut between the first and second portions of the gate electrode, so that the gate cut is self-aligned to the width of the rail.

2. The method according to claim 1, wherein the rails are formed of an electrically conductive material, and wherein:
   the opening is formed through the complete thickness of the rail exposed at the bottom of the trench, and through the remaining portion of dielectric material, so that the opening divides the rail into two separate portions, one on either side of the opening, and
   after formation of the gate cut, and after removal of any dielectric material from the bottom surface of the separated rail portions, an electrically conductive material is deposited in the trench, to thereby electrically connect the separate rail portions.

3. The method according to claim 1, wherein the rails are formed of a sacrificial material, and wherein:
   after formation of the trench, the sacrificial rail exposed at the bottom of the trench is removed relative to all its surrounding materials, thereby enlarging the trench and exposing the remaining portion of dielectric material at the bottom of the enlarged trench,
   the opening is formed through the remaining portion of dielectric material exposed at the bottom of the enlarged trench, and
   after formation of the gate cut, and after removal of any dielectric material from the bottom of the trench, an electrically conductive material is deposited in the opening and in the trench, to thereby form a conductive buried rail.

4. The method according to claim 1, wherein the rails are formed of a sacrificial material, and wherein:
   after formation of the trench, the opening is formed through the complete thickness of the sacrificial rail and through the remaining portion of dielectric material, so that the opening divides the rail into two separate portions, one on either side of the opening,
   after formation of the gate cut, the portions of the sacrificial rail are removed relative to all their surrounding materials, and
   an electrically conductive material is deposited in the opening and in the trench, to thereby form a conductive buried rail.

5. The method according to claim 1, wherein prior to recessing the planarized surface of the dielectric material:
   an opening is etched through the rail from the front side of the substrate,
   the opening is completely filled with a temporary material, forming a plug of the temporary material,
   the rail is thinned from the front side, relative to the plug, and
   dielectric material is deposited on top of the thinned rail on either side of the plug,
   wherein after the formation of the trench from the backside of the substrate, the opening is formed by removing the plug of temporary material.

6. The method according to claim 1, wherein the layer of dielectric material that forms the gate cut is a conformal layer.

7. The method according to claim 1, wherein the layer of dielectric material that forms the gate cut is a non-conformal layer.

8. The method according to claim 1, wherein the gate structure is one of an array of regularly spaced gate structures separated by dielectric portions, with spacers between the gate structures and the dielectric portions, and wherein formation of source or drain contacts to the fin portions and gate contacts to the gate electrodes is performed prior to the formation of multiple gate cuts produced simultaneously from the back of the substrate.

9. The method according to claim 8, wherein the array of gate structures is produced by the replacement gate technique.

10. The method according to claim 1, wherein the rails are formed of an electrically conductive material or of a sacrificial material that is to be replaced later by an electrically conductive material.

* * * * *